(12) United States Patent
Rotbard et al.

(10) Patent No.: US 9,817,595 B2
(45) Date of Patent: Nov. 14, 2017

(54) MANAGEMENT OF PEAK POWER CONSUMED BY MULTIPLE MEMORY DEVICES

(71) Applicant: APPLE INC., Cupertino, CA (US)

(72) Inventors: Barak Rotbard, Herzliya Pituach (IL); Itay Sagron, Herzliya Pituach (IL)

(73) Assignee: APPLE INC., Cupertino, CA (US)

( * ) Notice: Subject to any disclaimer, the term of this patent is extended or adjusted under 35 U.S.C. 154(b) by 32 days.

(21) Appl. No.: 15/008,470

(22) Filed: Jan. 28, 2016

(65) Prior Publication Data

US 2017/0220280 A1    Aug. 3, 2017

(51) Int. Cl.
*G06F 13/00*    (2006.01)
*G06F 3/06*    (2006.01)

(52) U.S. Cl.
CPC ............ *G06F 3/0625* (2013.01); *G06F 3/064* (2013.01); *G06F 3/0673* (2013.01)

(58) Field of Classification Search
None
See application file for complete search history.

(56) References Cited

U.S. PATENT DOCUMENTS

| | | |
|---|---|---|
| 5,327,389 A | 7/1994 | Seok et al. |
| 8,228,701 B2 | 7/2012 | Sokolov et al. |
| 8,254,172 B1 | 8/2012 | Kan |
| 8,432,738 B2 | 4/2013 | Nguyen |
| 8,572,311 B1 | 10/2013 | Shalvi et al. |
| 8,649,240 B2 | 2/2014 | McCombs et al. |
| 8,677,203 B1 | 3/2014 | Shalvi et al. |
| 8,745,369 B2 | 6/2014 | Yurzola et al. |
| 8,929,170 B2 | 1/2015 | Park et al. |
| 2013/0132652 A1 | 5/2013 | Wood et al. |
| 2014/0075133 A1 | 3/2014 | Li et al. |
| 2015/0098272 A1 | 4/2015 | Kasorla et al. |
| 2015/0113203 A1 | 4/2015 | Dancho et al. |
| 2015/0205540 A1 | 7/2015 | Yoo et al. |
| 2015/0331625 A1* | 11/2015 | Nishikubo ............... G06F 3/06 711/103 |
| 2016/0147444 A1 | 5/2016 | Neerman et al. |
| 2017/0060461 A1* | 3/2017 | Erez ..................... G06F 3/0625 |

OTHER PUBLICATIONS

U.S. Appl. No. 14/551,016 Office Action dated Aug. 17, 2016.
U.S. Appl. No. 14/551,016 Office Action dated Dec. 15, 2016.
U.S. Appl. No. 14/551,016 Office Action dated Apr. 10, 2017.

* cited by examiner

*Primary Examiner* — Brian Peugh
(74) *Attorney, Agent, or Firm* — D.KLIGLER IP SERVICES LTD.

(57) ABSTRACT

A controller includes an interface and a processor. The interface is configured to communicate with one or more memory devices that include multiple memory blocks. The processor is configured to hold information regarding power consumption of the memory blocks, to group at least some of the memory blocks into one or more storage groups, based on the information, such that the memory blocks in each storage group jointly consume less than a predefined power limit when the memory blocks in the storage group are applied a storage operation in parallel, and to apply the storage operation, in parallel, to the memory blocks in a selected storage group.

17 Claims, 3 Drawing Sheets

US 9,817,595 B2

MANAGEMENT OF PEAK POWER CONSUMED BY MULTIPLE MEMORY DEVICES

TECHNICAL FIELD

Embodiments described herein relate generally to data storage, and particularly to methods and systems for management of peak power consumed by multiple memory devices.

BACKGROUND

In various memory systems a controller stores data in multiple memory devices. Storage operations that access multiple memory devices in parallel may cause a peak of current and power consumption in the memory system.

Methods for controlling the peak current or peak power in multi-memory systems are known in the art. For example, U.S. Patent Application Publication 2015/0205540, whose disclosure is incorporated herein by reference, describes a memory system that includes nonvolatile memory devices (NVMs) connected to a controller via a channel. The memory devices are provided with data according to an interleaving approach. The controller respectively accesses the NVMs and determines a number of program operations that may be simultaneously executed by the NVMs in conjunction with an additional operation upon comparing a peak operating current associated with a sum of respective peak operating currents for the number of program operations and the at least one additional operation with a reference peak current.

U.S. Pat. No. 8,432,738, whose disclosure is incorporated herein by reference, describes a system and a method for executing a global memory command in a multi-chip non-volatile memory device having a plurality of non-volatile memories. The global memory command is received at each non-volatile memory concurrently. The memory command is initiated at different times relative to receiving the global memory command for at least two of the plurality of non-volatile memory to mitigate peak power consumption.

SUMMARY

An embodiment that is described herein provides a controller, including an interface and a processor. The interface is configured to communicate with one or more memory devices that include multiple memory blocks. The processor is configured to hold information regarding power consumption of the memory blocks, to group at least some of the memory blocks into one or more storage groups, based on the information, such that the memory blocks in each storage group jointly consume less than a predefined power limit when the memory blocks in the storage group are applied a storage operation in parallel, and to apply the storage operation, in parallel, to the memory blocks in a selected storage group.

In some embodiments, the processor is configured to hold the information by holding identities of one or more excess-power blocks among the memory blocks that each consumes a power level above a predefined power threshold when applied the storage operation. In other embodiments, the processor is configured to include no more than a predefined number of the excess-power blocks in each of the storage groups. In yet other embodiments, the processor is configured to hold, for the excess-power blocks, respective power consumption values, and to include in each of the storage groups one or more excess-power blocks that jointly consume less a predefined maximal power.

In an embodiment, the processor is configured to identify the excess-power blocks by applying the storage operation to each of the memory blocks individually, measuring a power level consumed by the memory device responsively to the storage operation, and identifying the memory blocks for which the power level exceeds a predefined power threshold. In another embodiments, the processor is configured to measure one or more programming times for one or more respective cell-subsets of the memory blocks, and to identify the excess-power blocks based, at least in part, on the measured programming times. In yet another embodiment, the controller is configured to apply the storage operation by performing one or more of: erasing the memory blocks of the selected storage group, programming data in each of the memory blocks of the selected storage group, and reading the data from each of the memory blocks of the selected storage group.

In some embodiments, the processor is configured to group the memory blocks such that each storage group contains no more than a single memory block from each memory device. In other embodiments, the controller is configured to group the memory blocks such that at least two of the memory blocks in a given storage group belong to a same memory device.

There is additionally provided, in accordance with an embodiment that is described herein, a method for data storage including, in a controller that stores data in one or more memory devices including multiple memory blocks, holding information regarding power consumption of the memory blocks. At least some of the memory blocks are grouped into one or more storage groups, based on the information, such that the memory blocks in each storage group jointly consume less than a predefined power limit when the memory blocks in the storage group are applied a storage operation in parallel. The storage operation is applied, in parallel, to the memory blocks in a selected storage group.

There is additionally provided, in accordance with an embodiment that is described herein, a storage system that includes one or more memory devices including multiple memory blocks and a controller. The controller is configured to communicate with the memory devices over a bus, to hold information regarding power consumption of the memory blocks, to group at least some of the memory blocks into one or more storage groups, based on the information, such that the memory blocks in each storage group jointly consume less than a predefined power limit when the memory blocks in the storage group are applied a storage operation in parallel, and to apply the storage operation, in parallel, to the memory blocks in a selected storage group.

These and other embodiments will be more fully understood from the following detailed description of the embodiments thereof, taken together with the drawings in which:

DETAILED DESCRIPTION OF EMBODIMENTS

Overview

Figure 1:
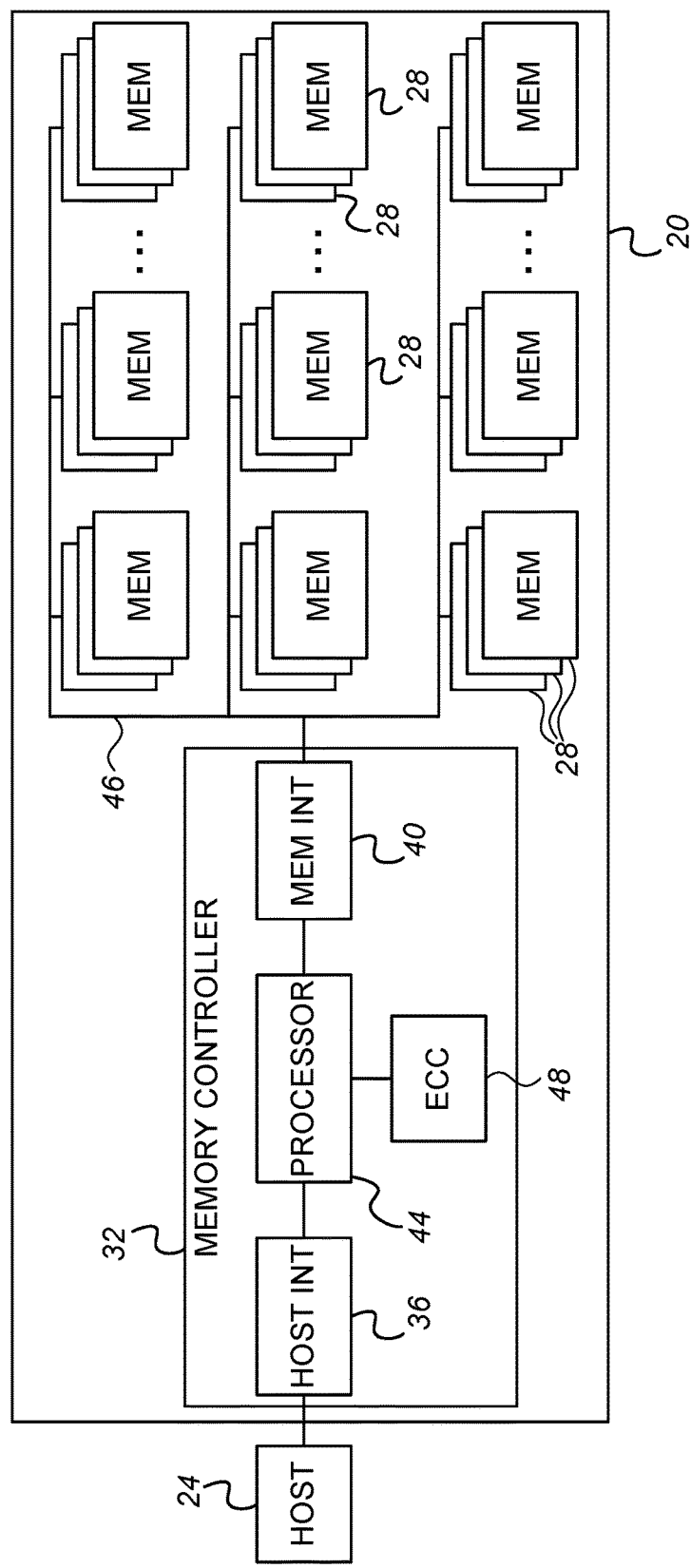
FIG. 1 is a block diagram that schematically illustrates a memory system, in accordance with an embodiment that is described herein.

Various storage systems comprise a controller that stores data in multiple memory devices. The controller typically communicates with the memory devices over a suitable bus. The memory devices comprise memory cells that store data by setting the memory cells to assume respective programming levels. The memory cells are typically programmed and read in data units that are referred to as "data pages" and erased in groups that are referred to as "erasure blocks" or "memory blocks."

To apply a storage operation such as a programming, readout or erasure operation, the controller sends a suitable storage command to the target memory device over the bus. Some storage systems support storage commands that access multiple memory devices in parallel. The controller may, for example, send a single command that targets multiple memory devices, or send multiple storage commands to the respective memory devices in a time-staggered manner. A memory device that receives a storage command typically executes the command independently of the other memory devices and may indicate to the controller when ready to receive subsequent commands.

In the context of the present disclosure and in the claims, a phrasing such as "storage operations applied to multiple memory devices in parallel" means that the execution periods of the storage operations by the respective individual memory devices overlap, at least partially. The overlapping execution typically causes a peak in power consumption that should meet the power consumption capabilities of the system. Although the description that follows refers mainly to power consumption of accessing memory blocks, the disclosed techniques are equally applicable in terms of current consumption. In addition, the disclosed techniques are applicable to power or current consumed by any suitable group of memory cells other than a memory block.

Embodiments that are disclosed herein provide methods and systems for managing the peak power consumed by multiple memory devices. Typically, a group of memory cells consumes an amount of power that falls within some nominal range when applied a respective storage operation. In some practical situations, however, a memory device comprises one or more memory blocks that each consumes excess power relative to the expected nominal power consumption. A memory block that consumes a higher power than the nominal range is referred to herein as an "excess-power block."

The system is typically designed for supporting up to a certain maximum peak power consumption by the multiple memory devices. When accessing multiple memory devices in parallel, if one or more of the memory blocks consumes excess power, the aggregated peak power may exceed the system power consumption constraint.

In some embodiments, the controller holds information regarding the power consumption of the various memory blocks of the memory devices. The information may be provided, for example, by the manufacturer of the memory devices, or learned by the memory controller. The controller may identify the excess-power blocks in various ways. In some embodiments, the controller holds identities of the memory blocks whose power consumption exceeds a predefined threshold. Additionally or alternatively, the controller may hold the actual power consumption value, possibly quantized to some set of discrete levels.

Based on the power consumption information, the controller groups the memory blocks into one or more storage groups (referred to as stripes) in which the memory blocks are accessed in parallel, such that the memory blocks in each storage group jointly consume less than a predefined power limit when undergoing a storage operation. Having defined the storage groups, the controller may safely apply the storage operation in parallel to the memory blocks in each of the storage groups.

The controller may assign memory blocks to the storage groups in various ways. In an example embodiment, the controller includes in each of the storage groups no more than a predefined number of excess-power blocks. In another embodiment, the controller includes in the storage groups one or more excess-power blocks whose respective power consumption values sum up to less than some predefined maximal power. In yet other embodiments, the controller groups the memory blocks in accordance with predefined valid combinations of the discrete power values assigned to the excess-power blocks.

In some embodiments, the storage groups contain only one memory block from each respective memory device. This scheme is applicable, for example, in implementing a redundant array of independent disks (RAID) scheme. In other embodiments, a storage group may contain two or more memory blocks belonging to one memory device, i.e., two memory blocks in two respective planes of the memory blocks.

In the disclosed techniques, the memory controller defines storage groups of multiple memory blocks so as to meet the system peak-power constraint when accessed in parallel. The controller has prior knowledge of the power consumption of the memory blocks. The controller groups the memory blocks using methods that would not have been possible without having this prior knowledge available.

By limiting the power consumption of each storage group, the system power-supply circuitry can be down-sized, and so can peak-power reduction elements such as capacitors. In addition, the disclosed techniques can be used to relax peak-power tolerances in manufacturing.

System Description

FIG. 1 is a block diagram that schematically illustrates a multi-device memory system 20, in accordance with an embodiment that is described herein. System 20 accepts data for storage from a host 24 and stores it in memory, and retrieves data from memory and provides it to the host. In the present example, system comprises a Solid-State Disk (SSD) that stores data for a host computer. In alternative embodiments, however, system 20 may be used in any other suitable application and with any other suitable host, such as in computing devices, cellular phones or other communication terminals, removable memory modules, Secure Digital (SD) cards, Multi-Media Cards (MMC) and embedded MMC (eMMC), digital cameras, music and other media players and/or any other system or device in which data is stored and retrieved.

System 20 comprises multiple memory devices 28, each comprising multiple memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells, can also be used.

In some embodiments, the memory cells of devices 28 comprise analog memory cell that hold a continuous, analog value of a physical parameter, such as an electrical voltage or charge. Any suitable type of analog memory cells, such as the types listed above, can be used. In the present example, each memory device 28 comprises a non-volatile memory of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

The memory cells are typically arranged in rows and columns. Typically, a given memory device comprises multiple erasure blocks (also referred to as memory blocks), i.e., groups of memory cells that are erased together. Data typically cannot be reprogrammed in-place, and memory blocks are therefore erased before being programmed with other data. Data is typically programmed to groups of memory cells, and retrieved from the groups of the memory cells in data units that are referred to as data pages, or simply pages, for brevity.

Each memory device 28 may comprise a packaged device or an unpackaged semiconductor chip or die. A typical SSD may comprise a number of 4 GB devices. Generally, however, system 20 may comprise any suitable number of memory devices of any desired type and size. Although the system configuration of FIG. 1 comprises multiple memory devices, some of the methods and systems described herein can also be used in systems having only a single memory device.

System 20 comprises a memory controller 32, which accepts data from host 24 and stores it in memory devices 28, and retrieves data from the memory devices and provides it to the host. Memory controller 32 comprises a host interface 36 for communicating with host 24, a memory interface 40 for communicating with memory devices 28, and a processor 44 that processes the stored and retrieved data. In some embodiments, controller 32 encodes the stored data with an Error Correction Code (ECC). In these embodiments, controller 32 comprises an ECC unit 48, which encodes the data before stored in devices 28 and decodes the ECC of data retrieved from devices 28. The functions of processor 44 can be implemented, for example, using software running on a suitable Central Processing Unit (CPU), using hardware (e.g., state machine or other logic), or using a combination of software and hardware elements.

Controller 32 communicates with memory devices 28 over a bus 46. Bus 46 may comprise any suitable link or bus such as a parallel bus or a serial bus, or a packet-based bus such as PCIe. Bus 46 may operate in accordance with any suitable standard or protocol, and at any suitable rate.

To apply a storage command to a given memory device, the controller sends the storage command to the memory device over bus 46. Types of storage commands include, for example, page write, page read and block erasure commands. The memory device executes the storage command internally, and sends back to the controller data and/or status information as specified by the command. The memory device typically indicates to the controller when the memory device is ready to accept subsequent commands. In some embodiments, system 20 supports storage commands that are applied to multiple memory devices in parallel. As will be described in detail below, in accessing multiple memory devices in parallel, the controller should avoid violating power consumption limitations of the system.

Memory controller 32, and in particular processor 44, may be implemented in hardware. Alternatively, the memory controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and memory controller 32 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by a processor or other element of the host system, or by any other type of memory controller. In some embodiments, host 24 and Memory controller 32 may be fabricated on the same die, or on separate dies in the same device package.

Grouping Multiple Memory Blocks Under Power Constraints

As described above, system 20 supports storage commands that are applied to multiple memory devices in parallel. Such storage commands typically result in overlapping execution within multiple memory devices, i.e., accessing multiple memory blocks in the target memory devices during some common time period.

The controller may apply parallel storage commands in various ways. For example, in one embodiment, the controller sends over bus 46 a single storage command that targets multiple memory devices. For example, the controller may apply a command for erasing one or more memory blocks in multiple memory devices.

In another embodiment, the memory controller applies multiple separate storage commands to multiple respective memory devices by sending the commands over bus 46 a packet-based link. In yet another embodiment, bus 46 supports communicating with only one memory device at a time, and the controller sends multiple storage commands to multiple respective memory devices, over the bus, in a staggered manner, i.e., the controller completes sending a command to one device and then sends a subsequent command, typically to another device.

System 20 typically supports peak power consumption up to some predefined power limit. The actual instantaneous power consumption in the system varies over time, because the memory devices typically consume significant power when executing a storage operation and much lower power when idle. Different storage commands are typically characterized by different power consumption. Power consumption peaks during the execution of a storage command may occur, e.g., during application of programming/erasure pulses during a write/erase operation, or when charging the bit-lines of the memory block in a read operation.

In the embodiments disclosed below, the controller defines groups of memory blocks in which a storage operation is to be applied in parallel, such that the joint peak power consumed by the memory blocks in the group does not exceed the predefined power limit. The memory blocks in each group may belong to different respective memory devices. Alternatively or additionally, one or more memory blocks of a given memory device may participate in one group.

Figure 2A:
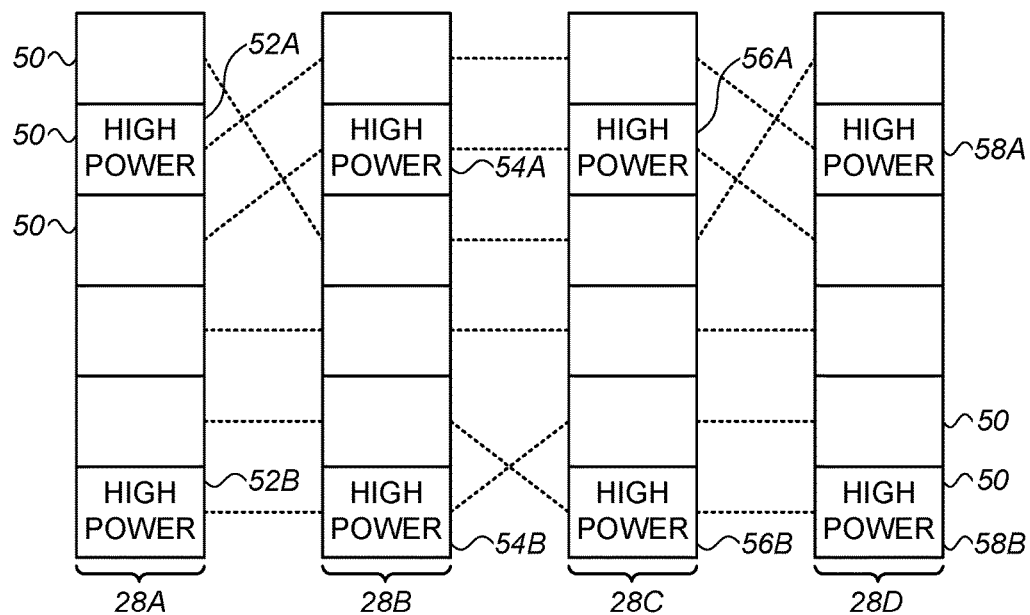
FIGS. 2A and 2B are diagrams that schematically illustrate schemes for grouping memory blocks in multiple memory devices under a power consumption constraint, in accordance with embodiments that are described herein.
Figure 2B:
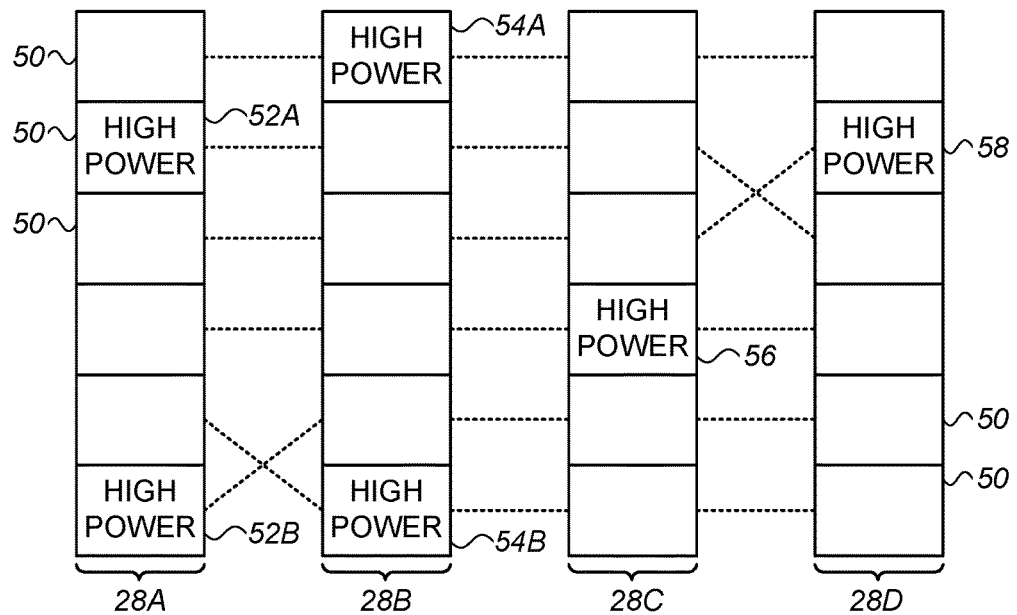

FIGS. 2A and 2B are diagrams that schematically illustrate schemes for grouping memory blocks in multiple memory devices under a power consumption constraint, in accordance with embodiments that are described herein. Such grouping may be applied, for example, in defining stripes for implementing a redundant array of independent disks (RAID) storage scheme.

FIGS. 2A and 2B depict memory devices 28A . . . 28D that each comprises multiple memory blocks 50. Each of memory devices 28 comprises memory blocks of which most consume power in a nominal range of power levels. The memory devices may, however, comprise one or more memory blocks that consume excess power relative to the expected nominal power. For determining whether a given block consumes excess power, its power consumption may be compared, for example, to the average power, or to the highest power of the nominal power rage. In the description that follows the term "nominal power" refers to some representative power level assigned to the nominal power range such the average or maximal power in the range. The memory blocks consuming excess power are also referred to herein as "excess-power blocks," and are marked as HIGH POWER blocks in the figures.

In the example of FIG. 2A, each of the memory devices comprises two excess-power blocks. Moreover, the location pattern of the excess-power block repeats among the memory devices. For example, in FIG. 2A, the excess-power blocks are located at the first and fifth block locations starting from the bottom in each of the memory devices. In the examples of FIGS. 2A and 2B, the controller groups the memory blocks into groups that each contains one block from each respective memory device.

In the present example, the system supports parallel access to four memory blocks of which up to two memory blocks are excess-power blocks. Using a naïve grouping scheme, according to which the controller groups memory blocks of the same physical location, would result in violating the system power consumption constraint, because each of the groups containing blocks 52A . . . 58A and 52B . . . 58B have more than two excess-power blocks.

Assuming that the controller is aware of the location pattern of the excess-power blocks, the controller can group the memory blocks, so as to meet the power consumption constraint, as seen in FIG. 2A. In the diagram, doted lines link among memory blocks that belong to a common group.

In FIG. 2B, memory devices 28 may contain a different number of excess-power blocks. For example, each of memory devices 28A and 28B contains two excess-power blocks, whereas each of memory devices 28C and 28D contains a single excess-power block. In addition, the locations of the excess-power blocks may differ from one memory device to another.

In FIG. 2B, each group of four memory blocks may contain up to a single excess-power block to meet the power consumption constraint. Assuming that the controller holds the identification of the excess-power blocks in each of the memory devices, the controller groups the memory blocks to meet the system power requirement, as seen in FIG. 2B.

The grouping schemes depicted in FIGS. 2A and 2B are given by way of example. In alternative embodiments, other suitable grouping schemes that meet the power consumption constraint are also possible.

Figure 3:
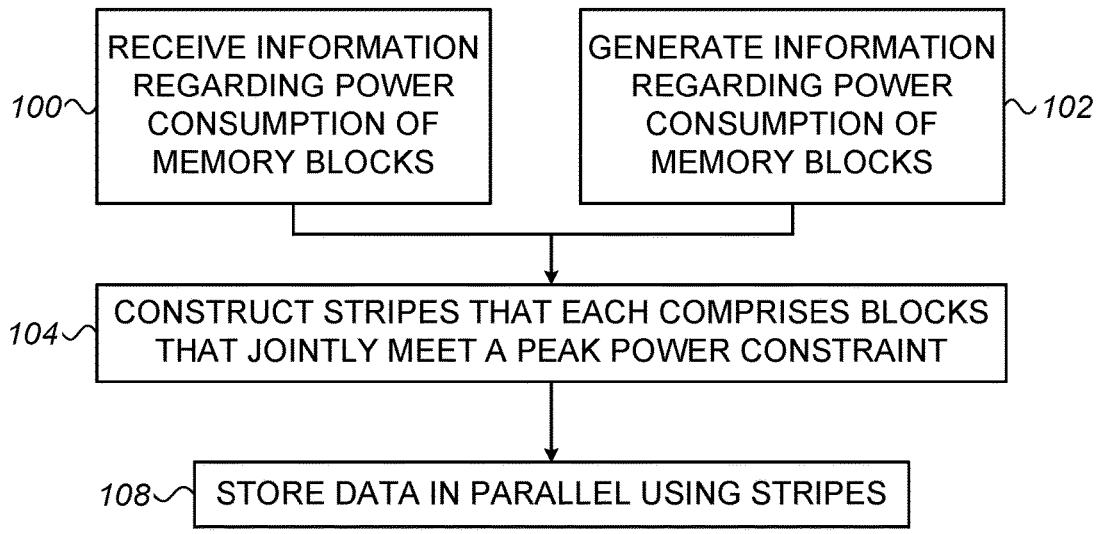
FIG. 3 is a flow chart that schematically illustrates a method for constructing block stripes across multiple memory devices, under a power consumption constraint, in accordance with an embodiment that is described herein.

FIG. 3 is a flow chart that schematically illustrates a method for constructing block stripes across multiple memory devices, under a power consumption constraint, in accordance with an embodiment that is described herein. The method is executed, for example, by controller 32 of storage system 20, described above.

The method begins with the controller receiving (e.g., from host 24) information regarding power consumption of the memory blocks in memory devices 28, at a reception information step 100. In some embodiments, the power consumption information comprises identification of the excess-power blocks in at least some of the memory devices in the system.

The identification information may comprise, for example, a block index or any other suitable block-addressing information. In cases in which the location pattern of the excess-power block repeats in the memory devices, the identification information requires very little storage space. Alternatively or additionally, the power consumption information comprises a power or current consumption value per excess-power block.

In some embodiments, instead of receiving the power consumption information, the controller learns this information, at an information generation step 102. Step 102 is described in more details in the method of FIG. 4 below. In an embodiment, the controller may execute step 102 for initializing and/or updating the power consumption information, as appropriate.

Following step 100 or 102, the controller proceeds to a stripe construction step, 104, at which the controller constructs stripes that each comprises multiple memory blocks. Based on the power consumption information of step 100 or 102, the controller construct the stripes such that the power consumed jointly by the memory blocks in each stripe does not exceed a predefined power consumption constraint, when a storage command is applied in parallel to the memory blocks in the stripe.

The controller may construct the stripes in various ways. In some embodiments, the controller limits the number of excess-power in each stripe to less than a predefined maximal number. For example, the controller may construct the stripes to comprise no more than a single excess-power block per stripe.

In some embodiments, the excess-power blocks are assigned respective power consumption values, which enable the controller to construct the stripes with higher flexibility. In one embodiment, the controller includes in each stripe one or more excess-power blocks so that the sum of their respective power consumption values is less than a predefined power consumption constraint.

In an embodiment, the excess-power blocks are assigned discrete power consumption values. In such embodiments, the controller defines combinations of the discrete power consumption values that are valid for constructing the stripes. Consider, for example, three power consumption values denoted L1, L2 and L3, wherein L1<L2<L3. The controller may define the following valid combinations: (L1), (L2), (L3), (L1 and L2) and (L1 and L3). In this example, the combination (L2 and L3) as well as any combination comprising more than two excess-power blocks are invalid.

At a storage step 108, the controller uses the stripes defined at step 104 to apply multiple storage operations in parallel to the memory blocks in the stripes. Following step 108, the method terminates.

Identifying Excess-Power Blocks

Figure 4:
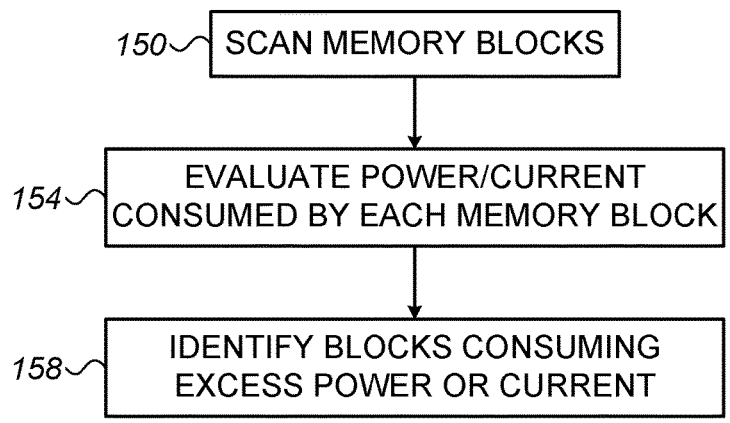
FIG. 4 is a flow chart that schematically illustrates a method for identifying excess-power blocks, in accordance with an embodiment that is described herein.

FIG. 4 is a flow chart that schematically illustrates a method for identifying excess-power blocks, in accordance with an embodiment that is described herein. The method may be executed, for example, by controller 32 before storing data in memory devices 28.

The method begins with the controller scanning the memory blocks in memory devices 28 of system 20 at a scanning step 150. For example, the controller scans the memory devices in some predefined order, and for each scanned device the controller scans the memory blocks in a suitable order such as sequentially. As another example, the controller may scan the first memory block in each memory device, than the second memory block in each device and so on. In alternative embodiments, any other scanning order can also be used.

At a power consumption evaluation step 154, the controller applies a storage operation to each scanned memory block, and measures the power consumed by the respective memory device. In some embodiments, the controller senses the current consumed by the memory device in response to applying the storage operation, and evaluates the power consumed based on the sensed current.

At an identification step 158, the controller identifies whether a scanned memory block consumes excess power or current. If the power consumed exceeds a predefined power limit, the controller identifies the respective memory block as an excess-power block, and stores addressing information for the identified block.

In some embodiments, the controller stores for the identified blocks the respective power level consumed. In an embodiment, the controller stores the ratio between the block power consumption and the nominal block power consumption. For example, for a block whose power consumption exceeds the nominal power consumption by 20%, the controller may store the normalized number 1.2, or the excess percentage 20. Alternatively, the controller quantizes the power consumption level into one of multiple predefined discrete levels and stores, for example, an integer indicating the quantized level. Following step 158, the method terminates.

In some embodiments, the peak power consumption has a certain statistical distribution across different groups of memory cells within the memory blocks. For example, different word lines in the same block may consume different amounts of power when individually programmed. In such embodiments, to identify the excess-power blocks, the power consumption measurements per memory block (or word line) may be averaged over a suitable time period, e.g., 5-20 micro-seconds.

In some embodiments, the power consumption of the memory blocks (or of cell-subsets thereof) is highly correlated with some other parameter(s) characterizing the memory blocks. For example, the inventors have discovered that there is a relatively high correlation between the programming time of data pages to word lines, and certain respective peak power metrics. In such embodiments, knowledge of the programming times of the data pages can be taken into consideration and used in identifying the excess-power blocks. This approach is advantageous also because measuring the programming times can be implemented within the controller and is much less complicated than measuring power or current consumption, which typically requires using external measurement means.

In some embodiments, instead of using the method of FIG. 4 by the controller to identify the excess-power blocks, this information is produced offline and provided to the controller. For example, a mapping of the excess-power blocks may be provided by the vendor of the memory devices. Alternatively, offline tests may be conducted to the memory device for mapping the memory blocks, and the controller uses this mapping to assign the memory blocks to stripes, as described above.

The embodiments described above are given by way of example, and other suitable embodiments can also be used. For example, in some embodiments, the power consumption of a memory block depends on the storage operation applied. In such embodiments, the controller may define the storage groups depending on the respective different storage operations. Alternatively, the controller defines the storage groups based on the storage operation resulting in the highest power consumption among the storage operations.

In the description above, we mainly assume that the same storage operation is applied to all the memory blocks in the group. In alternative embodiments, the controller may apply different storages operations to different blocks in the same group in parallel. For example, the controller may erases some of the memory blocks in a given group, and program other memory blocks in the same group in parallel.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A controller, comprising:
   an interface, which is configured to communicate with one or more memory devices comprising multiple memory blocks; and
   a processor, which is configured to:
      hold identities of one or more excess-power blocks among the memory blocks of the one or more memory devices, wherein each of the one or more excess-power blocks consumes a power level above a predefined power threshold when being applied a selected storage operation;
      group at least some of the memory blocks into one or more storage groups, based on the identities, such that the memory blocks in each storage group jointly consume less than a predefined power limit when the memory blocks in the storage group are applied a storage operation in parallel; and
      apply the storage operation, in parallel, to the memory blocks in a selected storage group.

2. The controller according to claim 1, wherein the processor is configured to include no more than a predefined number of the excess-power blocks in each of the storage groups.

3. The controller according to claim 1, wherein the processor is configured to:
   hold, for the excess-power blocks, respective power consumption values; and
   include in each of the storage groups one or more excess-power blocks that jointly consume less than a predefined maximal power.

4. The controller according to claim 1, wherein the processor is configured to:
   apply the storage operation to each of the memory blocks individually;
   measure a power level consumed by the memory device responsively to the storage operation; and
   identify the memory blocks for which the power level exceeds the predefined power threshold.

5. The controller according to claim 1, wherein the processor is configured to:
   measure one or more programming times for one or more respective cell-subsets of the memory blocks; and
   identify the excess-power blocks based, at least in part, on the measured programming times.

6. The controller according to claim 1, wherein the controller is configured to apply the storage operation by performing one or more of:
   erasing the memory blocks of the selected storage group;
   programming data in each of the memory blocks of the selected storage group; and
   reading the data from each of the memory blocks of the selected storage group.

7. The controller according to claim 1, wherein the processor is configured to group the memory blocks such that each storage group contains no more than a single memory block from each memory device.

8. The controller according to claim 1, wherein the controller is configured to group the memory blocks such that at least two of the memory blocks in a given storage group belong to a same memory device.

9. A method for data storage comprising:
   in a controller that stores data in one or more memory devices comprising multiple memory blocks, holding identities of one or more excess-power blocks among the memory blocks of the one or more memory devices, wherein each of the one or more excess-power blocks consumes a power level above a predefined power threshold when being applied a selected storage operation;
   grouping at least some of the memory blocks into one or more storage groups, based on the identities, such that the memory blocks in each storage group jointly consume less than a predefined power limit when the memory blocks in the storage group are applied a storage operation in parallel; and
   applying the storage operation, in parallel, to the memory blocks in a selected storage group.

10. The method according to claim 9, wherein grouping the memory blocks comprises including no more than a predefined number of the excess-power blocks in each of the storage groups.

11. The method according to claim 9, wherein holding the identities comprises, assigning for the excess-power blocks respective power consumption values, and including in each of the storage groups one or more excess-power blocks that jointly consume less than a predefined maximal power.

12. The method according to claim 9, wherein holding the identities comprises identifying the excess-power blocks by applying the storage operation to each of the memory blocks individually, measuring a power level consumed by the memory device responsively to the storage operation, and identifying the memory blocks for which the power level exceeds the predefined power threshold.

13. The method according to claim 9, and comprising measuring one or more programming times for one or more respective cell-subsets of the memory blocks, and identifying the excess-power blocks based, at least in part, on the measured programming times.

14. The method according to claim 9, wherein applying the storage operation comprises performing one or more of: erasing the memory blocks of the selected storage group, programming data in each of the memory blocks of the selected storage group, and reading the data from each of the memory blocks of the selected storage group.

15. The method according to claim 9, wherein grouping the memory blocks comprises grouping the memory blocks such that each storage group contains no more than a single memory block from each memory device.

16. The method according to claim 9, wherein grouping the memory blocks comprises grouping the memory blocks such that at least two of the memory blocks in a given storage group belong to a same memory device.

17. A storage system comprising:
   one or more memory devices comprising multiple memory blocks; and
   a controller, which is configured to:
      communicate with the memory devices over a bus;
      hold identities of one or more excess-power blocks among the memory blocks of the one or more memory devices, wherein each of the one or more excess-power blocks consumes a power level above a predefined power threshold when being applied a selected storage operation;
      group at least some of the memory blocks into one or more storage groups, based on the identities, such that the memory blocks in each storage group jointly consume less than a predefined power limit when the memory blocks in the storage group are applied a storage operation in parallel; and
      apply the storage operation, in parallel, to the memory blocks in a selected storage group.

* * * * *